(12) United States Patent
Oh et al.

(10) Patent No.: US 9,231,601 B1
(45) Date of Patent: Jan. 5, 2016

(54) TECHNIQUES RELATING TO PHASE-LOCKED LOOP CIRCUITS

(71) Applicant: Altera Corporation, San Jose, CA (US)

(72) Inventors: Kyung Suk Oh, Cupertino, CA (US); Heetae Ahn, San Jose, CA (US); Hae-Chang Lee, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/593,940

(22) Filed: Jan. 9, 2015

(51) Int. Cl.
*H03L 7/06* (2006.01)
*H03L 7/08* (2006.01)
*H03L 7/099* (2006.01)
*H05K 3/36* (2006.01)

(52) U.S. Cl.
CPC *H03L 7/08* (2013.01); *H03L 7/099* (2013.01); *H05K 3/36* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,181,203 B1* | 1/2001 | Newlin | ............ | H03F 3/3066 327/359 |
| 6,859,112 B2 | 2/2005 | Mason | | |
| 7,602,260 B1 | 10/2009 | Atesoglu | | |
| 2002/0047552 A1* | 4/2002 | Sano | ............ | G09G 3/28 315/169.2 |
| 2007/0285144 A1* | 12/2007 | Bhowmik | ............ | H03H 11/265 327/261 |
| 2007/0287403 A1* | 12/2007 | Sjoland | ............ | H03D 7/145 455/326 |
| 2010/0073051 A1* | 3/2010 | Rao | ............ | H03L 7/0898 327/157 |
| 2012/0068745 A1* | 3/2012 | Hsieh | ............ | H03L 7/18 327/157 |
| 2012/0074998 A1* | 3/2012 | Brett | ............ | H03L 1/022 327/157 |
| 2013/0076450 A1* | 3/2013 | Rao | ............ | H03L 7/0896 331/34 |
| 2014/0091843 A1* | 4/2014 | Upadhyaya | ............ | H04L 27/0014 327/157 |
| 2014/0266342 A1* | 9/2014 | Arai | ............ | H03L 7/099 327/156 |
| 2015/0077192 A1* | 3/2015 | Sadhu | ............ | H03B 5/1206 331/117 FE |
| 2015/0109072 A1* | 4/2015 | Bakalski | ............ | H03J 3/20 333/174 |
| 2015/0180485 A1* | 6/2015 | Shanan | ............ | H03L 7/093 327/156 |
| 2015/0180486 A1* | 6/2015 | Shanan | ............ | H03L 7/085 327/156 |
| 2015/0214892 A1* | 7/2015 | Hsieh | ............ | H03B 5/1275 327/157 |
| 2015/0263702 A1* | 9/2015 | Jou | ............ | H03J 5/246 327/156 |
| 2015/0263742 A1* | 9/2015 | McLaurin | ............ | H03L 7/085 327/158 |

* cited by examiner

*Primary Examiner* — Adam Houston
(74) *Attorney, Agent, or Firm* — Steven J. Cahill (57) ABSTRACT

A phase-locked loop circuit includes a regulator circuit, first and second inductor-capacitor tank circuits, and first and second load capacitors. The regulator circuit generates a supply voltage. The first load capacitor is coupled to the regulator circuit and to the first inductor-capacitor tank circuit. The first load capacitor provides current for the supply voltage to the first inductor-capacitor tank circuit. The second load capacitor is coupled to the regulator circuit and to the second inductor-capacitor tank circuit. The second load capacitor provides current for the supply voltage to the second inductor-capacitor tank circuit.

20 Claims, 9 Drawing Sheets

TECHNIQUES RELATING TO PHASE-LOCKED LOOP CIRCUITS

FIELD OF THE DISCLOSURE

The present disclosure relates to electronic circuits, and more particularly, to techniques relating to phase-locked loop circuits.

BACKGROUND

A phase-locked loop (PLL) is an electronic circuit that adjusts the frequency of a feedback clock signal based on the frequency of a reference clock signal. Phase-locked loops (PLLs) provide periodic signals for data recovery, data transfer, and other clocking functions in integrated circuits. PLLs often supply a clock signal generated by an oscillator to one or more frequency divider circuits that divide the clock signal to a lower frequency clock signal for distribution around an integrated circuit or system.

BRIEF SUMMARY

According to some embodiments, a phase-locked loop circuit includes a regulator circuit, first and second inductor-capacitor tank circuits, and first and second load capacitors. The regulator circuit generates a supply voltage. The first load capacitor is coupled to the regulator circuit and to the first inductor-capacitor tank circuit. The first load capacitor provides current for the supply voltage to the first inductor-capacitor tank circuit. The second load capacitor is coupled to the regulator circuit and to the second inductor-capacitor tank circuit. The second load capacitor provides current for the supply voltage to the second inductor-capacitor tank circuit.

Various objects, features, and advantages of the present invention will become apparent upon consideration of the following detailed description and the accompanying drawings.

DETAILED DESCRIPTION

A phase-locked loop (PLL) circuit typically includes an oscillator circuit. One type of oscillator circuit includes an inductor-capacitor (LC) tank circuit. An oscillator with an LC tank circuit typically generates a smaller amount of jitter and phase noise in its output clock signals than a ring oscillator. However, an oscillator with an LC tank circuit often has a narrower tuning range in its output clock signals than a ring oscillator, if the inductance of the one or more inductors in the LC tank circuit is not variable. Variable capacitors are used to tune an LC tank circuit within a small frequency range.

A PLL circuit can include more than one LC tank circuit to cover a wider frequency range. A PLL circuit may have two or more LC tank circuits in order to increase the tuning range of the output clock signals of the PLL circuit. In a PLL circuit having two or more LC tank circuits, each LC tank circuit generates a different frequency range. Only one of the LC tank circuits in the PLL circuit is enabled to generate output clock signals at any one time. When frequencies that are outside the frequency range of the enabled LC tank circuit are required, a different one of the LC tank circuits in the PLL circuit is enabled that can generate the required frequencies. The LC tank circuits together provide a wider tuning range in the output clock signals of the PLL circuit.

According to some embodiments disclosed herein, a single phase-locked loop (PLL) circuit has two or more LC tank circuits. The PLL circuit also has a different load capacitor coupled to each of its LC tank circuits. In some embodiments, the load capacitance of a regulator circuit is distributed among the load capacitors coupled to the LC tank circuits in the PLL circuit.

An integrated circuit may have multiple phase-locked loop (PLL) circuits. A different supply voltage may be provided to each of the PLL circuits in an integrated circuit. Oscillations in the output clock signals of the PLL circuits may generate supply voltage noise in their respective supply voltages. If two or more PLL circuits are coupled to the same semiconductor substrate in an integrated circuit, supply voltage noise in the supply voltages provided to the PLL circuits may be cross-coupled through the semiconductor substrate. Thus, supply voltage noise in one PLL circuit may be cross-coupled through the semiconductor substrate to the supply voltage provided to the other PLL circuit. If the output clock signals of the two PLL circuits are out-of-phase or have different frequencies, cross-coupling of noise through the semiconductor substrate between the PLL circuits may generate supply voltage noise in each PLL circuit that is out-of-phase with or has a different frequency than the output clock signals of that PLL circuit. Supply voltage noise in a PLL circuit that is out-of-phase with or has a different frequency than the output clock signals of the PLL circuit may cause unwanted noise or jitter in the output clock signals of the PLL circuit.

As transistor dimensions are reduced in semiconductor device fabrication technologies, and the frequencies of clock signals generated by PLL circuits increase, cross-coupling jitter may cause an unacceptably high level of noise in the supply voltages provided to the PLL circuits in an integrated circuit. According to some embodiments disclosed herein, the resonant frequency of an LC circuit in a supply voltage delivery circuit that provides a supply voltage to an LC tank circuit in a PLL circuit is selected to be closer to the operating frequency of a clock signal generated by the LC tank circuit to reduce supply voltage noise in the supply voltage delivery circuit.

Figure 1:
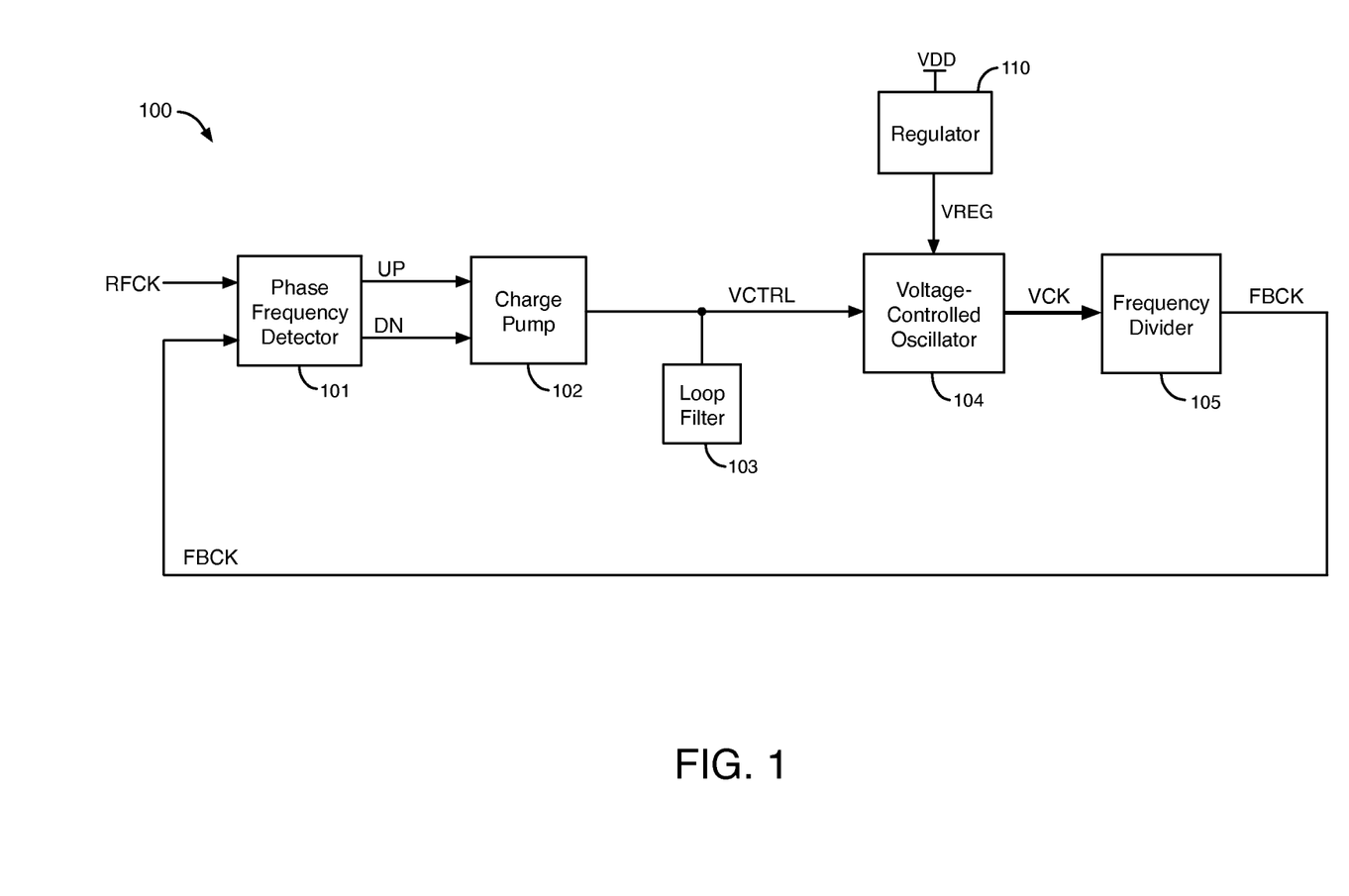
FIG. 1 illustrates an example of a phase-locked loop circuit, according to an embodiment of the present invention.

FIG. 1 illustrates an example of a phase-locked loop circuit 100, according to an embodiment of the present invention. In the embodiment of FIG. 1, phase-locked loop (PLL) circuit 100 includes a phase frequency detector circuit 101, charge pump circuit 102, a loop filter circuit 103, voltage-controlled oscillator circuit 104, frequency divider circuit 105, and regulator circuit 110. PLL circuit 100 is in an integrated circuit. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

A reference clock signal RFCK is provided to a first input of phase frequency detector circuit 101. A feedback clock signal FBCK is provided to a second input of phase frequency detector circuit 101. Phase frequency detector circuit 101 compares the phase and the frequency of reference clock signal RFCK to the phase and the frequency of feedback clock signal FBCK to generate phase error signals UP and DN. In an embodiment, phase frequency detector circuit 101 generates pulses in phase error signals UP and DN that vary based on changes in the differences between the phases and frequencies of clock signals RFCK and FBCK. Phase error signals UP and DN are provided to inputs of charge pump circuit 102.

Charge pump circuit 102 generates an analog control voltage VCTRL at its output. Charge pump circuit 102 varies control voltage VCTRL based on changes in the UP and DN phase error signals. The control voltage VCTRL is low pass filtered by the loop filter circuit 103. According to an exemplary embodiment, charge pump circuit 102 sends charge to the loop filter circuit 103 in response to logic high pulses in the UP signal, and charge pump circuit 102 drains charge from the loop filter circuit 103 in response to logic high pulses in the DN signal.

The control voltage VCTRL as filtered by loop filter circuit 103 is provided to a control input of voltage-controlled oscillator (VCO) circuit 104. VCO circuit 104 generates periodic output clock signals VCK. VCO circuit 104 varies the frequencies of its output clock signals VCK in response to changes in control voltage VCTRL.

Regulator circuit 110 receives a supply voltage VDD. Regulator circuit 110 generates a regulated supply voltage VREG using charge from supply voltage VDD. Supply voltage VREG is provided to a supply voltage input of VCO circuit 104. In an exemplary embodiment, regulator circuit 110 may be a step-down voltage regulator that generates a constant supply voltage VREG based on supply voltage VDD. In this embodiment, the regulated supply voltage VREG is less than the supply voltage VDD.

One or more of the output clock signals VCK of VCO circuit 104 are provided to inputs of frequency divider circuit 105. Frequency divider circuit 105 generates the feedback clock signal FBCK based on one or more of clock signals VCK. Frequency divider circuit 105 causes the frequency of clock signal FBCK to equal the frequency of at least one of clock signals VCK divided by a frequency division value. The frequency division value of frequency divider circuit 105 may be, for example, a positive integer or fractional number.

According to an exemplary embodiment, phase frequency detector circuit 101 generates logic high pulses in the UP signal that are longer than the logic high pulses in the DN signal when the frequency of reference clock signal RFCK is greater than the frequency of feedback clock signal FBCK. When logic high pulses in the UP signal are longer than logic high pulses in the DN signal, charge pump circuit 102 increases the control voltage VCTRL. In response to control voltage VCTRL increasing, VCO circuit 104 increases the frequencies of clock signals VCK, which causes the frequency of clock signal FBCK to increase.

In this embodiment, phase frequency detector circuit 101 generates logic high pulses in the DN signal that are longer than the logic high pulses in the UP signal when the frequency of feedback clock signal FBCK is greater than the frequency of reference clock signal RFCK. When logic high pulses in the DN signal are longer than logic high pulses in the UP signal, charge pump circuit 102 decreases control voltage VCTRL. In response to control voltage VCTRL decreasing, VCO circuit 104 decreases the frequencies of clock signals VCK, which causes the frequency of clock signal FBCK to decrease.

VCO circuit 104 varies the frequencies of clock signals VCK based on changes in the control voltage VCTRL, until the reference clock signal RFCK and the feedback clock signal FBCK are phase aligned within a static phase offset of PLL 100. The static phase offset is an error margin of PLL 100. Clock signals RFCK and FBCK have the same or approximately the same frequency when the phases of clock signals RFCK and FBCK are aligned within the static phase offset.

Figure 2:
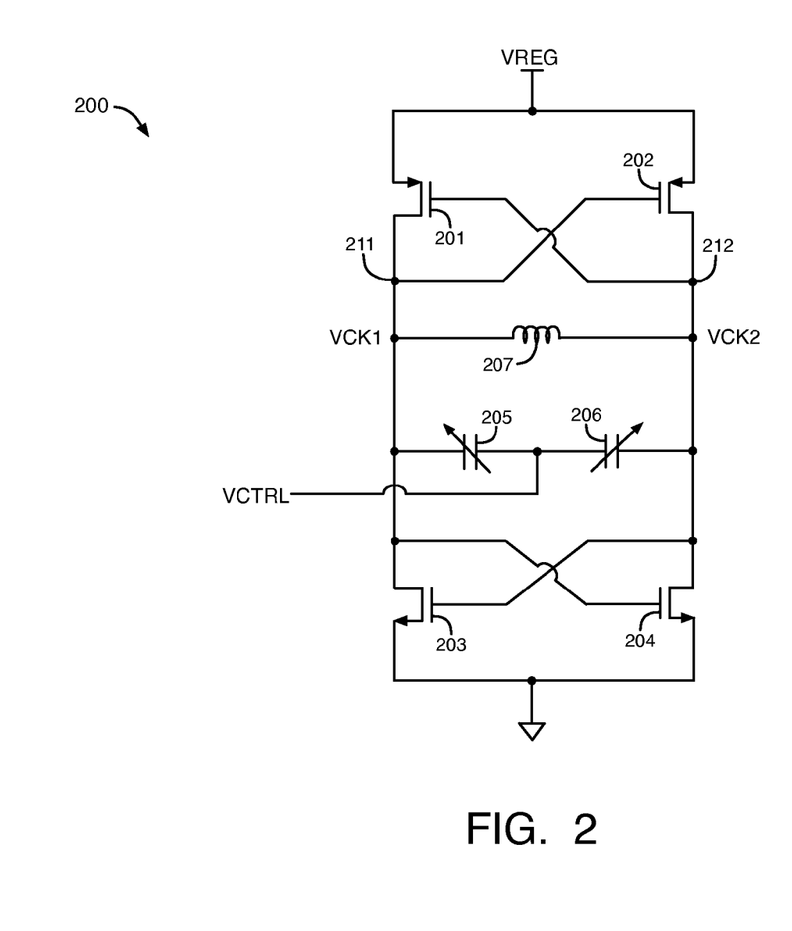
FIG. 2 is a schematic diagram of an inductor-capacitor (LC) tank circuit, according to an embodiment of the present invention.

FIG. 2 is a schematic diagram of an inductor-capacitor (LC) tank circuit 200, according to an embodiment of the present invention. LC tank circuit 200 is at least part of a voltage-controlled oscillator. LC tank circuit 200 is an example of voltage-controlled oscillator circuit 104 in FIG. 1. LC tank circuit 200 includes p-channel field-effect transistors (FETs) 201-202, n-channel FETs 203-204, inductor 207, and varactors 205-206.

Varactors 205-206 are capacitors that have variable capacitances. Varactors 205-206 can be, for example, reverse-biased diodes. The capacitance of each of varactors 205-206 varies in response to changes in the voltage across the varactor. The control voltage VCTRL generated by charge pump 102 and filtered by loop filter 103 is provided to a terminal of each of varactors 205-206. The capacitances of varactors 205-206 vary based on changes in control voltage VCTRL. The inductance of inductor 207 is constant.

LC tank circuit 200 generates a first periodic clock signal VCK1 at output node 211. LC tank circuit 200 generates a second periodic clock signal VCK2 at output node 212. Clock signals VCK1 and VCK2 are examples of two of clock signals VCK shown in FIG. 1. The gate of transistor 201 is coupled to node 212 at the drains of transistors 202 and 204. Inductor 207 and varactor 206 are also coupled to node 212. The gate of transistor 202 is coupled to node 211 at the drains of transistors 201 and 203. Inductor 207 and varactor 205 are also coupled to node 211.

P-channel transistors 201-202 are cross-coupled. N-channel transistors 203-204 are cross-coupled. The cross-coupled transistors 201-204 compensate for the resistive losses of inductor 207 and varactors 205-206. The sources of transistors 201-202 are coupled to a node at the regulated supply voltage VREG received from regulator circuit 110. The sources of transistors 203-204 are coupled to a common ground voltage node.

The inductor 207 and the varactors 205-206 form an inductor-capacitor (LC) circuit. The LC circuit has a resonant frequency that is based on the inductance of inductor 207 and the capacitances of varactors 205-206. The frequencies of clock signals VCK1 and VCK2 settle to the resonant frequency of the LC circuit. The resonant frequency $\omega_0$ of an LC circuit is shown below in equation (1), where L is the inductance of inductor 207, and C is the effective capacitance of varactors 205-206.

$$\omega_0 = \frac{1}{\sqrt{LC}} \quad (1)$$

The capacitance of each of the varactors 205-206 varies based on changes in the control voltage VCTRL. In response to changes in the capacitances of varactors 205-206, the resonant frequency of the LC circuit of FIG. 2 changes. The frequencies of clock signals VCK1 and VCK2 settle to the new resonant frequency of the LC circuit of FIG. 2 after the control voltage VCTRL changes.

Figure 3:
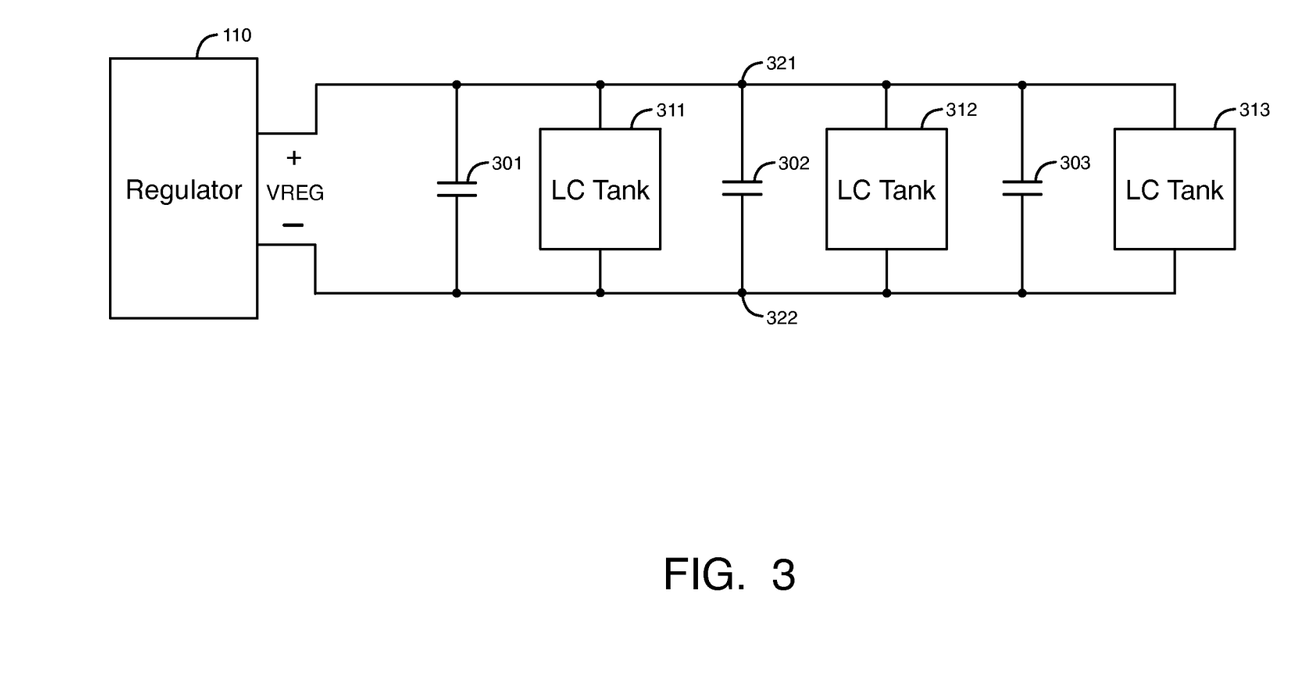
FIG. 3 illustrates an example of an oscillator system having three LC tank circuits that are each next to a different load capacitor, according to an embodiment of the present invention.

FIG. 3 illustrates an example of an oscillator system having three LC tank circuits that are each next to a different load capacitor, according to an embodiment of the present invention. The oscillator system of FIG. 3 is in a single PLL circuit. The oscillator system of FIG. 3 includes regulator circuit 110, three load capacitors 301-303, and three LC tank circuits 311-313. LC tank circuit 200 is an example of the circuit structure that may be in one or more of the LC tank circuits 311-313. In an embodiment, each of LC tank circuits 311-313 includes the circuit structure of LC tank circuit 200. According to other embodiments, LC tank circuits 311-313 have one or more other oscillator circuit architectures that have inductor-capacitor (LC) circuits.

In an embodiment, load capacitors 301-303 and LC tank circuits 311-313 may be in a single voltage-controlled oscillator (VCO) circuit in a single PLL circuit. As an example, load capacitors 301-303 and LC tank circuits 311-313 may be in VCO circuit 104. In alternative embodiments, the LC tank circuits 311-313 are in two or three VCO circuits. For example, each of LC tank circuits 311-313 may be in a separate VCO circuit in an embodiment having three VCO circuits. In an embodiment having two or more VCO circuits, all of the VCO circuits are in the same PLL circuit (e.g., PLL circuit 100).

In some embodiments, the inductors 207 in the LC tank circuits 311-313 are not adjustable, which limits the frequency range of the output clock signals of each of the LC tank circuits 311-313. In some embodiments, each of the LC tank circuits 311-313 generates a different frequency range in its output clock signals. Providing a different frequency range for the output clock signals of each of the LC tank circuits 311-313 increases the frequency range that can be generated in the output clock signals of the PLL circuit. Typically, only one of the LC tank circuits in a PLL is generating oscillations in its output clock signals at any one time.

As shown in FIG. 3, the regulated supply voltage VREG generated by regulator circuit 110 is provided across each of load capacitors 301-303 between node 321 and node 322. The regulated supply voltage VREG is also provided across each of the LC tank circuits 311-313. Each of load capacitors 301-303 and each of LC tank circuits 311-313 is coupled between nodes 321 and 322. Thus, each of the load capacitors 301-303 is coupled to each of the LC tank circuits 311-313.

In the embodiment of FIG. 3, the load capacitance associated with regulator circuit 110 is distributed to the three LC tank circuits, such that each of the LC tank circuits 311-313 is next to one of the load capacitors 301-303. LC tank circuit 311 is next to load capacitor 301. LC tank circuit 312 is next to load capacitor 302. LC tank circuit 313 is next to load capacitor 303. In other embodiments, an oscillator system may include four or more LC tank circuits and the same number of load capacitors, such that each of the load capacitors is next to one of the LC tank circuits.

Regulator circuit 110 provides output current to each of LC tank circuits 311-313 through conductors. If LC tank circuits 312 and 313 are a relatively large distance from regulator circuit 110, regulator circuit 110 by itself may not be able to adjust its output current fast enough to prevent voltage VREG from decreasing if the current drawn by LC tanks circuits 312-313 suddenly increases.

The load capacitors 301-303 store charge received from regulator circuit 110. Load capacitors 301-303 provide current for supply voltage VREG to LC tank circuits 311-313, respectively. The current provided by load capacitors 301-303 can change more quickly than the output current of regulator circuit 110, in response to sudden changes in the current drawn by LC tank circuits 311-313, respectively. Capacitors 301-303 also function as low pass filters that reduce high frequency noise in voltage VREG on nodes 321-322. Capacitors 301-303 maintain voltage VREG at a more stable voltage.

According to various embodiments, capacitors 301-303 may have the same capacitance or different capacitances. The capacitances of capacitors 301-303 may be selected based on the amount of die area available on the integrated circuit. In some embodiments, the total load capacitance designated for regulator circuit 110 may be divided by three and provided to capacitors 301-303 to prevent an increase in the die area used by capacitors 301-303. For example, if 90 picofarads of load capacitance is designated for regulator circuit 110, then each of capacitors 301-303 may have 30 picofarads of capacitance.

Providing a load capacitor next to each LC tank circuit may not be sufficient to provide enough noise reduction in some applications that generate high clock signal frequencies. According to other embodiments, supply voltage noise in a supply voltage provided to a PLL circuit is reduced by selecting the resonant frequency of an LC circuit that delivers the supply voltage to an LC tank circuit in the PLL circuit to be closer to the operating frequency of the LC tank circuit. The LC circuit includes the load capacitor and the delivery inductances between the regulator circuit and the LC tank circuit. Supply voltage noise that is cross-coupled through a semiconductor substrate between two or more PLL circuits can be reduced using this technique.

Figure 4:
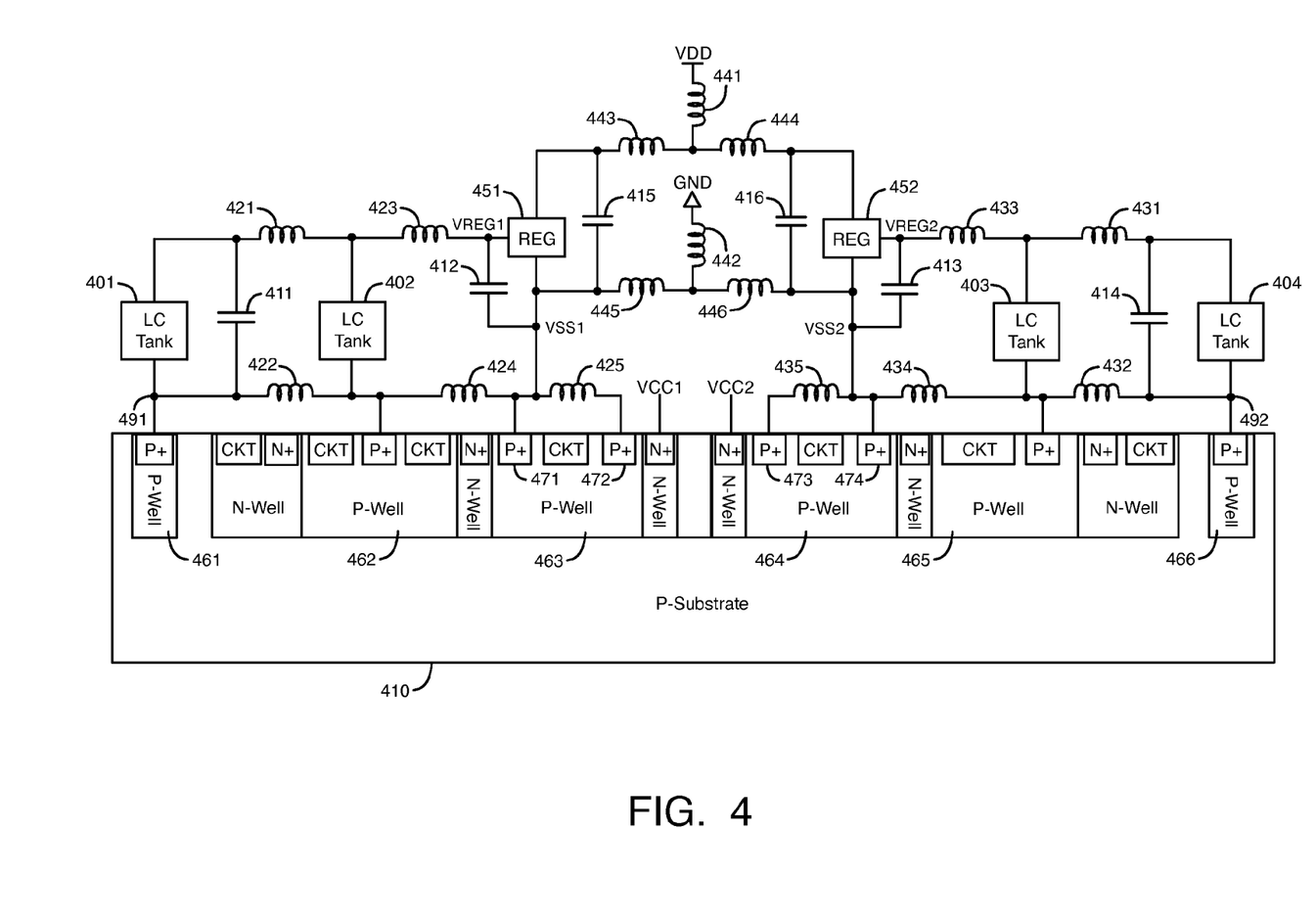
FIG. 4 illustrates examples of regulator circuits, LC tank circuits, load capacitors, conductors having delivery inductance, and other circuits in phase-locked loop circuits, according to an embodiment of the present invention.

FIG. 4 illustrates examples of regulator circuits, inductor-capacitor (LC) tank circuits, load capacitors, conductors having delivery inductance, and other circuits in phase-locked loop circuits, according to an embodiment of the present invention. The circuitry of FIG. 4 includes inductor-capacitor (LC) tank circuits 401-404, load capacitors 411-414, capacitors 415-416, p-type semiconductor substrate 410, delivery inductances 421-425, 431-435, and 441-446, and regulator (REG) circuits 451-452.

In an embodiment, each of the LC tank circuits 401-404 has the circuit structure of LC tank circuit 200 shown in FIG. 2. According to other embodiments, LC tank circuits 401-404 have one or more other oscillator circuit architectures that have inductor-capacitor (LC) circuits. In still other embodiments, one or a subset of LC tank circuits 401-404 have the circuit structure of LC tank circuit 200, and the remaining LC tank circuits 401-404 have one or more other LC tank oscillator circuit architectures.

P-type semiconductor substrate 410 is referred to as p-substrate 410 in FIG. 4. P-substrate 410 includes 6 p-type wells 461-466 (i.e., p-wells). P-substrate 410 also includes 6 n-type wells (i.e., n-wells). Each of the p-wells in substrate 410 includes one or two highly doped p+ contact regions. Each of the n-wells in substrate 410 includes one or two highly doped n+ contact regions. Some of the n-wells and p-wells in substrate 410 also include regions that form additional portions of circuits, which are identified as CKT in FIG. 4.

LC tank circuits 401 and 402, regulator circuit 451, and load capacitors 411-412 are part of a first phase-locked loop (PLL) circuit. LC tank circuits 401 and 402 may be in a single oscillator circuit, such as VCO circuit 104, or in two separate oscillator circuits within the first PLL circuit. Regulator circuit 451, load capacitors 411-412, and the circuitry in p-wells 461-463 are also part of the first PLL circuit.

LC tank circuits 403 and 404, regulator circuit 452, and load capacitors 413-414 are part of a second PLL circuit. The first and second PLL circuits are two separate and distinct PLL circuits within the same integrated circuit. Only portions of the first and second PLL circuits are shown in FIG. 4. LC tank circuits 403 and 404 may be in a single oscillator circuit, such as VCO circuit 104, or in two separate oscillator circuits within the second PLL circuit. The circuitry in p-wells 464-466 are also part of the second PLL circuit. LC tank circuits 401-404, regulator circuits 451-452, capacitors 411-416, and p-substrate 410 are in the same integrated circuit.

The 16 delivery inductances 421-425, 431-435, and 441-446 all represent parasitic inductances that are intrinsic to the conductors that connect together circuits 401-404, 411-416, 410, and 451-452 shown in FIG. 4. One or more of the delivery inductances 421-425, 431-435, and 441-446 may be in the same integrated circuit as the PLL circuits and substrate 410. One or more of the delivery inductances 421-425, 431-435, and 441-446 may be in a package that houses the integrated circuit. In some embodiments, a subset of the delivery inductances (e.g., inductances 421-425, 431-435, and 443-446) are parasitic inductances in conductors within the same integrated circuit as substrate 410, and the remaining delivery inductances (e.g., inductances 441-442) are parasitic inductances in conductors within a package. The conductors that connect together the circuits of FIG. 4 are shown as solid black lines in FIG. 4.

A supply voltage VDD is provided to regulator circuits 451 and 452 through conductors having parasitic delivery inductances 441 and 443-444 as shown in FIG. 4. Regulator circuits 451-452 are coupled to a node at the ground voltage GND through conductors having parasitic delivery inductances 442 and 445-446 as shown in FIG. 4. Capacitors 412 and 415 are coupled to regulator circuit 451. Capacitors 413 and 416 are coupled to regulator circuit 452.

Regulator circuit 451 generates a first regulated supply voltage VREG1 based on the supply voltage VDD-GND. The first regulated supply voltage VREG1 is provided to LC tank circuit 402 through conductors having parasitic delivery inductance 423. The first regulated supply voltage VREG1 is provided to LC tank circuit 401 through conductors having parasitic delivery inductances 421 and 423.

The voltage across capacitor 412 is VREG1-VSS1. Voltage VSS1 is a ground voltage generated from ground voltage GND through conductors having delivery inductances 442 and 445. Ground voltage VSS1 is provided to LC tank circuit 402 through conductors having delivery inductance 424. Ground voltage VSS1 is provided to LC tank circuit 401 through conductors having delivery inductances 422 and 424. Regulator circuit 451, the conductors having inductances 421-424, and load capacitors 411-412 are a supply voltage delivery circuit that provides the supply voltage VREG1-VSS1 to LC tank circuits 401-402.

Ground voltage VSS1 is also provided to p+ contact region 471 in p-well 463, to p+ contact region 472 in p-well 463 through conductors having delivery inductance 425, to the p+ contact region in p-well 462 through conductors having delivery inductance 424, and to the p+ contact region in p-well 461 through conductors having delivery inductances 422 and 424. LC tank circuits 401-402 are coupled to the p+ contact regions in p-wells 461-462, to the p+ contact regions 471-472 in p-well 463, and to regulator circuit 451 through conductors having the delivery inductances shown in FIG. 4.

Regulator circuit 452 generates a second regulated supply voltage VREG2 based on the supply voltage VDD-GND. The second regulated supply voltage VREG2 is provided to LC tank circuit 403 through conductors having parasitic delivery inductance 433. The second regulated supply voltage VREG2 is provided to LC tank circuit 404 through conductors having parasitic delivery inductances 431 and 433.

The voltage across capacitor 413 is VREG2-VSS2. Voltage VSS2 is a ground voltage generated from ground voltage GND through conductors having delivery inductances 442 and 446. Ground voltage VSS2 is provided to LC tank circuit 403 through conductors having delivery inductance 434. Ground voltage VSS2 is provided to LC tank circuit 404 through conductors having delivery inductances 432 and 434. Regulator circuit 452, the conductors having inductances 431-434, and load capacitors 413-414 are a supply voltage delivery circuit that provides the supply voltage VREG2-VSS2 to LC tank circuits 403-404.

Ground voltage VSS2 is also provided to p+ contact region 474 in p-well 464, to p+ contact region 473 in p-well 464 through conductors having delivery inductance 435, to the p+ contact region in p-well 465 through conductors having delivery inductance 434, and to the p+ contact region in p-well 466 through conductors having delivery inductances 432 and 434. LC tank circuits 403-404 are coupled to the p+ contact regions in p-wells 465-466, to the p+ contact regions 473-474 in p-well 464, and to regulator circuit 452 through conductors having the delivery inductances shown in FIG. 4.

Typically, only one of LC tank circuits 401 or 402 in the first PLL circuit is enabled at any one time to generate oscillating output clock signals. The other LC tank circuit 401 or 402 is disabled and does not generate output clock signals. Typically, only one of LC tank circuits 403 or 404 in the second PLL circuit is enabled at any one time to generate oscillating output clock signals. The other LC tank circuit 403 or 404 is disabled and does not generate output clock signals. Because LC tank circuits 401-402 are in a separate PLL relative to LC tank circuits 403-404, one of LC tank circuits 401-402 and one of LC tank circuits 403-404 may be generating oscillating output clock signals at the same time.

Oscillations in the output clock signals of the LC tank circuits 401-404 may generate supply voltage noise in the supply voltage delivery circuits of FIG. 4 that include delivery inductances 421-424 and 431-434 and load capacitors 411-414. Supply voltage noise in the supply voltage delivery circuits of FIG. 4 can be cross-coupled between nodes 491 and 492 via p-substrate 410, including p-wells 461 and 466. Cross-coupling of supply voltage noise between the supply voltage delivery circuits of FIG. 4 can increase the supply voltage noise in the supply voltage delivery circuits of FIG. 4. Cross-coupled supply voltage noise in the supply voltage delivery circuits may adversely affect the operation of the PLL circuits and other circuitry in the same integrated circuit.

According to some embodiments disclosed herein, noise in a supply voltage that is provided to an LC tank circuit in a PLL is decreased by decreasing the impedance of an LC circuit in a supply voltage delivery circuit that provides the supply voltage to the LC tank circuit. The LC circuit in the supply voltage delivery circuit includes a delivery inductance and a load capacitor. The impedance of the LC circuit in the supply voltage delivery circuit is decreased by selecting the resonant frequency of the LC circuit to be at, near, or closer to an operating frequency of the output clock signals of the LC tank circuit in the PLL. This technique reduces supply voltage noise in the supply voltage delivery circuit that provides the supply voltage to the LC tank circuit. Using Ohm's law for complex impedances V=Z×I, decreasing the impedance Z of the LC circuit reduces the supply voltage noise V if the current I remains constant. This technique can be used to reduce supply voltage noise in the supply voltages that are provided by supply voltage delivery circuits to LC tank circuits in two different PLL circuits coupled to the same semiconductor substrate, as shown in FIG. 4. Because supply voltage noise in the two different PLL circuits is reduced, the supply voltage noise that is cross-coupled through the semiconductor substrate between the supply voltage delivery circuits in the two different PLL circuits is also reduced.

For example, the resonant frequency of the LC circuit formed by load capacitor 411 and delivery inductances 421-422 may be selected to be at, near, or closer to the operating frequencies of the output clock signals of LC tank circuit 401. The frequencies of the output clock signals of an oscillator circuit in a PLL circuit vary in response to changes in the frequency of the input reference clock signal RFCK provided to the PLL circuit. Therefore, as a more specific example, the resonant frequency of the LC circuit formed by load capacitor 411 and delivery inductances 421-422 may be selected to be at, near, or closer to an average expected frequency of at least one of the output clock signals of LC tank circuit 401.

As another example, the resonant frequency of the LC circuit formed by load capacitor 412 and delivery inductances 423-424 may be selected to be at, near, or closer to an average expected frequency of at least one of the output clock signals of LC tank circuit 402. As yet another example, the resonant frequency of the LC circuit formed by load capacitor 413 and delivery inductances 433-434 may be selected to be at, near, or closer to an average expected frequency of at least one of the output clock signals of LC tank circuit 403. As still another example, the resonant frequency of the LC circuit formed by load capacitor 414 and delivery inductances 431-432 may be selected to be at, near, or closer to an average expected frequency of at least one of the output clock signals of LC tank circuit 404. The average expected frequencies of the output clock signals of LC tank circuits 401-404 are the average frequencies that are expected in these output clock signals when the respective LC tank circuits 401-404 are enabled.

In an embodiment, the resonant frequencies of all 4 LC circuits in the supply voltage delivery circuits of FIG. 4 that are identified above may be selected to be at, closer to, or near the average expected frequencies of the output clock signals of the respective LC tank circuits 401-404. As a specific example that is not intended to be limiting, the resonant frequencies of the 4 LC circuits in the supply voltage delivery circuits of FIG. 4 may be within 10%, 20%, 30%, or 40% of the average expected frequencies of the output clock signals of the respective LC tank circuits 401-404. In this embodiment, the supply voltage noise is reduced in both of the supply voltages that are provided by the supply voltage delivery circuits to the LC tank circuits 401-404. Because supply voltage noise in each of the two PLL circuits of FIG. 4 is reduced, the supply voltage noise that is cross-coupled through substrate 410 between the supply voltage delivery circuits in the two PLL circuits of FIG. 4 is also reduced.

The capacitances of load capacitors 411-414 can be selected based on equation (2) below to achieve desired resonant frequencies for the respective LC circuits. In equation (2), C is the capacitance of the respective load capacitor 411-414, L is the combined inductance of the two respective delivery inductances 421-422, 423-424, 433-434, or 431-432, and F is the desired resonant frequency for the respective LC circuit.

$$F = \frac{1}{2\pi\sqrt{LC}} \quad (2)$$

In some embodiments, the delivery inductance L in equation (2) is the delivery inductance of the conductors between the subject LC tank circuit and the next LC tank circuit in the same PLL circuit that is closer to the regulator circuit. If the subject LC tank circuit is the closest LC tank circuit to the regulator circuit in the PLL circuit, then the delivery inductance L in equation (2) is the delivery inductance of the conductors between the subject LC tank circuit and the regulator circuit.

Figure 5:
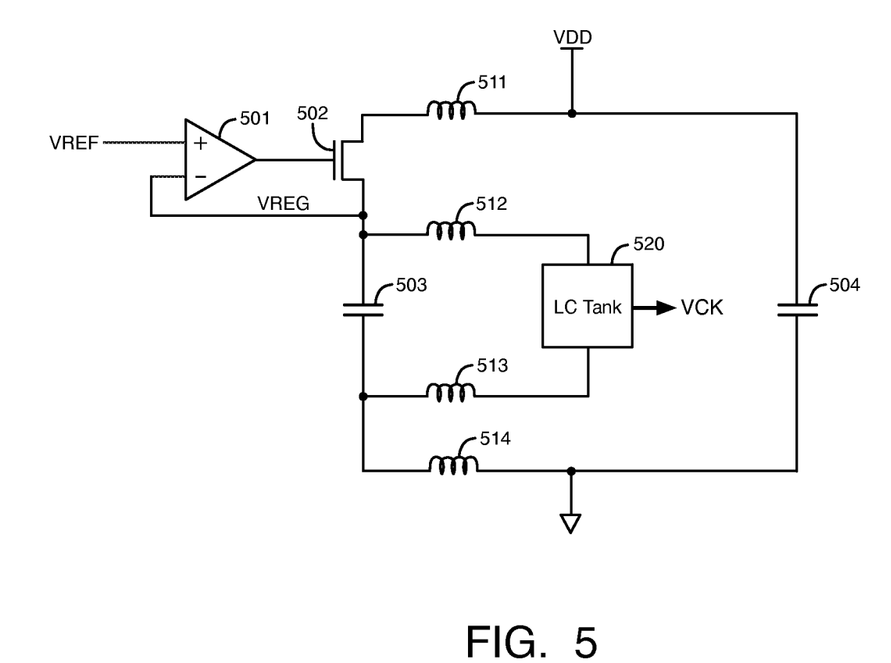
FIG. 5 illustrates a portion of a phase-locked loop circuit, according to an embodiment of the present invention.

FIG. 5 illustrates a portion of a phase-locked loop circuit, according to an embodiment of the present invention. FIG. 5 shows an amplifier circuit 501, an re-channel field-effect transistor (FET) 502, load capacitor 503, supply capacitor 504, delivery inductances 511-514, and LC tank circuit 520. LC tank circuit 200 shown in FIG. 2 is an example of LC tank circuit 520. According to other embodiments, LC tank circuit 520 has another type of LC oscillator circuit architecture. Delivery inductances 511-514 represent parasitic inductances in the conductors that connect together circuits in FIG. 5. Amplifier circuit 501, transistor 502, capacitors 503-504, and the conductors having delivery inductances 512-513 are all in the same integrated circuit. The conductors having delivery inductances 511 and 514 may be partly in the integrated circuit and partly in a package.

The circuitry shown in FIG. 5 is coupled between a node at supply voltage VDD and a node at the ground voltage. Supply capacitor 504 reduces noise in supply voltage VDD. Amplifier circuit 501 and transistor 502 are part of a regulator circuit that generates a regulated supply voltage VREG for LC tank circuit 520 using charge from supply voltage VDD. A constant reference voltage VREF is provided to the non-inverting (+) input of amplifier circuit 501. The regulated supply voltage VREG generated at the drain of transistor 502 is provided to the inverting (−) input of amplifier circuit 501. Amplifier circuit 501 generates a voltage at the gate of transistor 502 that causes supply voltage VREG to be equal to or nearly equal to voltage VREF.

In FIG. 5, current flows from the node at supply voltage VDD, through delivery inductance 511, through transistor 502, through delivery inductance 512, through LC tank circuit 520, and through delivery inductances 513-514 to the node at the ground voltage. Amplifier circuit 501, transistor 502, delivery inductances 512 and 513, and load capacitor 503 are a supply voltage delivery circuit that provides a supply voltage VREG to LC tank circuit 520. Supply voltage noise in voltage VREG can be reduced using the techniques described herein. For example, the resonant frequency of the LC circuit formed by load capacitor 503 and delivery inductances 512-513 may be selected to be at, near, or closer to an operating frequency of at least one of the output clock signals VCK of LC tank circuit 520. Load capacitor 503 also reduces noise and jitter in the output clock signals VCK of LC tank circuit 520 by providing a current to LC tank circuit 520 that responds quickly to changes in the current drawn by LC tank circuit 520 from voltage VREG.

Figure 6A:
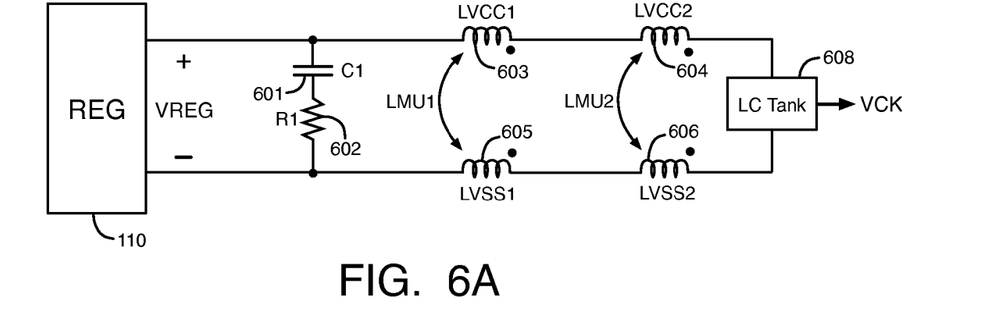
FIG. 6A illustrates a portion of a phase-locked loop (PLL) circuit that includes a regulator circuit, a load capacitor, a parasitic resistor, delivery inductances, and an LC tank circuit, according to an embodiment of the present invention.

FIG. 6A illustrates a portion of a phase-locked loop (PLL) circuit that includes regulator circuit 110, load capacitor 601, parasitic resistor 602, delivery inductances 603-606, and LC tank circuit 608. LC tank circuit 608 is part of an oscillator circuit in the PLL circuit. Parasitic resistor 602 represents parasitic resistance that is intrinsic to conductors coupled to load capacitor 601. Delivery inductances 603-606 represent parasitic inductances that are intrinsic to the conductors that couple regulator circuit 110 to LC tank circuit 608.

Figure 6B:
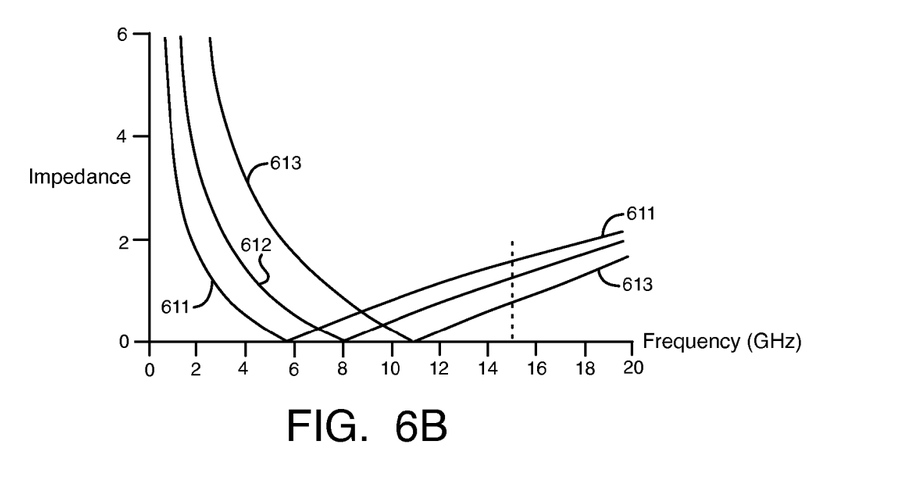
FIG. 6B is a graph that shows the impedance of the regulated supply voltage delivery circuit for the LC tank circuit in FIG. 6A over various frequencies, according to an embodiment of the present invention.

FIG. 6B is a graph that shows the impedance of the supply voltage delivery circuit that includes load capacitor 601 and delivery inductances 603-606 over various frequencies in the output clock signals VCK of LC tank circuit 608, according to an embodiment of the present invention. The second column of Table 1 below shows the three capacitance values of 43 picofarads (pF), 21.5 pF, and 10.75 pF for load capacitor 601 (C1) that were used to generate the three curves 611, 612, and 613, respectively, shown in FIG. 6B. The curves 611-613 shown in FIG. 6B were generated using a resistance value (R1) of zero ohms for parasitic resistor 602.

The inductance values of delivery inductances 603, 604, 605, and 606 are identified as LVCC1, LVCC2, LVSS1, and LVSS2, respectively, in FIG. 6A and in Table 1. The mutual inductance between delivery inductances 603 and 605 is LMU1 in FIG. 6A and in Table 1. The mutual inductance between delivery inductances 604 and 606 is LMU2 in FIG. 6A and in Table 1. The loop inductance of FIG. 6A is LLOOP in Table 1. All of the inductance values shown in the third through the ninth columns of Table 1 are in picohenries (pH). The tenth column of Table 1 shows the supply voltage noise (SVN) in supply voltage VREG in FIG. 6A at a frequency of 15 gigahertz (GHz) in the output clock signals VCK of LC tank circuit 608 for the three capacitance values of capacitor 601. The eleventh column of Table 1 shows the percentage decrease (16%) in the supply voltage noise caused by decreasing the capacitance of capacitor 601 from 43 pF to 21.5 pF at 15 GHz, and the percentage decrease (48%) in the supply voltage noise caused by decreasing the capacitance of capacitor 601 from 43 pF to 10.75 pF at 15 GHz.

Curves 611-613 of FIG. 6B show that the impedance of the LC circuit formed by load capacitor 601 and delivery inductances 603-606 reaches zero at a higher frequency of the output clock signals VCK of LC tank circuit 608 as the capacitance of capacitor 601 is decreased. For example, the impedance of the LC circuit formed by load capacitor 601 and delivery inductances 603-606 reaches zero at frequencies of about 5.5 GHz, 8 GHz, and 11 GHz for capacitances of 43 pF, 21.5 pF, and 10.75 pF for capacitor 601, as shown by curves 611-613, respectively, of FIG. 6B. The resonant frequency of the LC circuit formed by load capacitor 601 and delivery inductances 603-606 equals the frequency at which the impedance of this LC circuit reaches its minimum value (i.e., zero impedance in FIG. 6B). Each of the three curves 611-613 increases roughly linearly after reaching zero impedance as the frequencies of the output clock signals VCK of LC tank circuit 608 are increased further. At higher frequencies greater than about 10 GHz, the impedance of the LC circuit is smaller at smaller capacitance values of capacitor 601. At a frequency of 15 GHz, for example, in clock signals VCK, the impedance of the LC circuit is smaller at smaller capacitance values of capacitor 601, as shown at the dotted line in FIG. 6B. As a result, decreasing the capacitance of capacitor 601 causes the supply voltage noise in supply voltage VREG to decrease at higher frequencies (e.g., 15 GHz) in clock signals VCK, as shown in Table 1. By decreasing the supply voltage noise in the supply voltages VREG in two PLL circuits, supply voltage noise that is cross-coupled through a semiconductor substrate between the supply voltage delivery circuits of the two PLL circuits is also reduced.

Figure 6C:
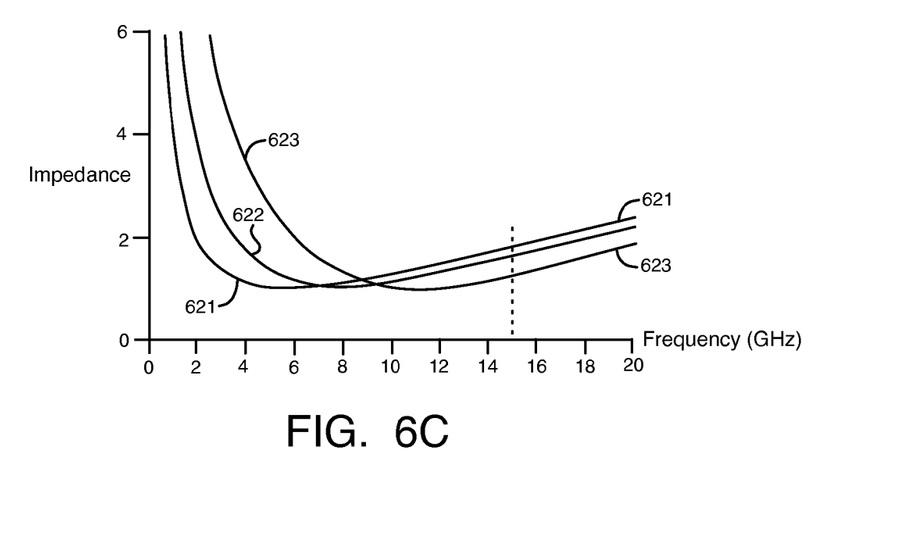
FIG. 6C is a graph that shows the impedance of the regulated supply voltage delivery circuit for the LC tank circuit in FIG. 6A having a non-zero parasitic resistance over various frequencies, according to another embodiment of the present invention.

FIG. 6C is a graph that shows the impedance of the supply voltage delivery circuit that includes delivery inductances 603-606 and load capacitor 601 having a non-zero parasitic resistance over various frequencies in the output clock signals VCK of LC tank circuit 608, according to another embodiment of the present invention. The second column of Table 2 below shows the three capacitance values of 43 picofarads (pF), 21.5 pF, and 10.75 pF for load capacitor 601 that were used to generate the three curves 621, 622, and 623, respectively, shown in FIG. 6C. The curves 621-623 shown in FIG. 6C were generated using a resistance R1 for parasitic resistor 602 of 1 ohm. The inductances LVCC1, LVCC2, LMU1, LVSS1, LVSS2, LMU2, and LLOOP used to generate the curves 621-623 of FIG. 6C are the same values used to generate the curves 611-613 of FIG. 6B, as shown in Table 2 below. All of the inductance values shown in the third through the ninth columns of Table 2 are in picohenries (pH).

TABLE 1

| Curve | C1 | LVCC1 | LVCC2 | LMU1 | LVSS1 | LVSS2 | LMU2 | LLOOP | SVN | % |
|---|---|---|---|---|---|---|---|---|---|---|
| 611 | 43 | 116 | 115 | 113 | 47 | 45 | 39 | 18 | 1.54 | |
| 612 | 21.5 | 116 | 115 | 113 | 47 | 45 | 39 | 18 | 1.30 | 16 |
| 613 | 10.75 | 116 | 115 | 113 | 47 | 45 | 39 | 18 | 0.80 | 48 |

TABLE 2

| Curve | C1 | LVCC1 | LVCC2 | LMU1 | LVSS1 | LVSS2 | LMU2 | LLOOP | SVN | % |
|---|---|---|---|---|---|---|---|---|---|---|
| 621 | 43 | 116 | 115 | 113 | 47 | 45 | 39 | 18 | 1.84 | |
| 622 | 21.5 | 116 | 115 | 113 | 47 | 45 | 39 | 18 | 1.64 | 11 |
| 623 | 10.75 | 116 | 115 | 113 | 47 | 45 | 39 | 18 | 1.28 | 30 |

The tenth column of Table 2 shows the supply voltage noise (SVN) in supply voltage VREG in FIG. 6A at a frequency of 15 GHz in the output clock signals VCK of LC tank circuit 608 for the three capacitances of capacitor 601 at a resistance of 1 ohm in R1. The eleventh column of Table 2 shows the percentage decrease (11%) in the supply voltage noise caused by decreasing the capacitance of capacitor 601 from 43 pF to 21.5 pF at 15 GHz, and the percentage decrease (30%) in the supply voltage noise caused by decreasing the capacitance of capacitor 601 from 43 pF to 10.75 pF at 15 GHz.

Curves 621-623 of FIG. 6C show that the LC circuit formed by load capacitor 601 and delivery inductances 603-606 reaches its minimum impedance at higher frequencies of the output clock signals VCK of LC tank circuit 608 as the capacitance of capacitor 601 is decreased. Each of the three curves 621-623 of FIG. 6C increases roughly linearly after reaching its minimum impedance as the frequencies of the output clock signals VCK of LC tank circuit 608 are increased further. At a frequency of 15 GHz, for example, in clock signals VCK, the impedance of the LC circuit is smaller at smaller capacitance values of capacitor 601, as shown at the dotted line in FIG. 6C. Thus, decreasing the capacitance of capacitor 601 causes the supply voltage noise in supply voltage VREG to decrease at a frequency of 15 GHz in clock signals VCK, as shown in Table 2. However, the reduction in the supply voltage noise in Table 2 is less than in Table 1 for the same reductions in the capacitance values of capacitor 601, because the resistance of resistor 602 is 1 ohm.

Figure 7A:
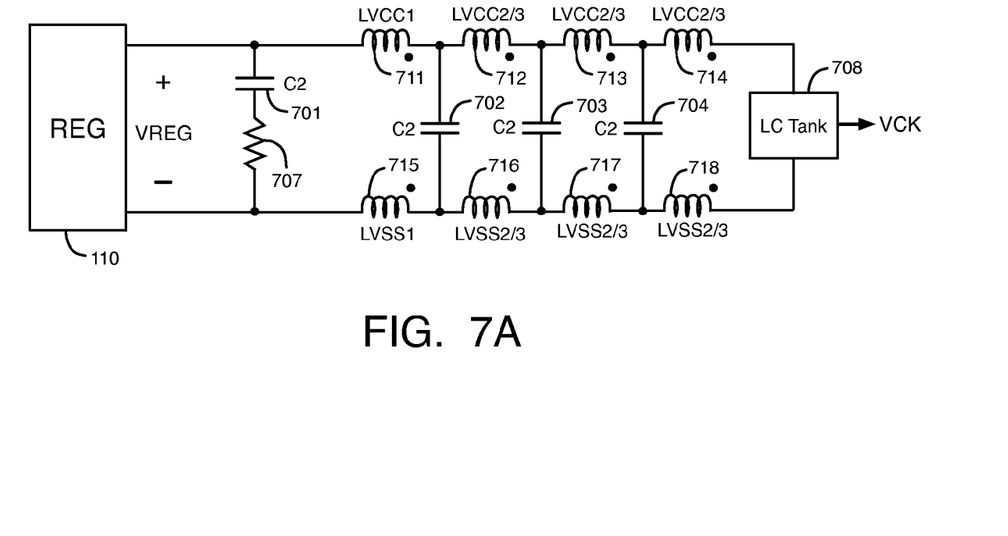
FIG. 7A illustrates a portion of a phase-locked loop (PLL) circuit that includes a regulator circuit, load capacitors, a parasitic resistor, delivery inductances, and an LC tank circuit, according to an embodiment of the present invention.

FIG. 7A illustrates a portion of a phase-locked loop (PLL) circuit that includes regulator circuit 110, load capacitors 701-704, parasitic resistor 707, delivery inductances 711-718, and LC tank circuit 708. LC tank circuit 708 is in an oscillator circuit in the PLL circuit. Parasitic resistor 707 represents parasitic resistance that is intrinsic to conductors coupled to load capacitor 701. Delivery inductances 711-718 represent parasitic inductances that are intrinsic to the conductors that couple regulator circuit 110 to LC tank circuit 708.

Load capacitors 701-704 and delivery inductances 711-718 are distributed inductor-capacitor (LC) circuits. In an embodiment of FIG. 7A, the PLL circuit has three additional LC tank circuits that are not shown in FIG. 7A to simplify the drawing, and each of the three additional LC tank circuits is next to a different one of the load capacitors 701-703.

Figure 7B:
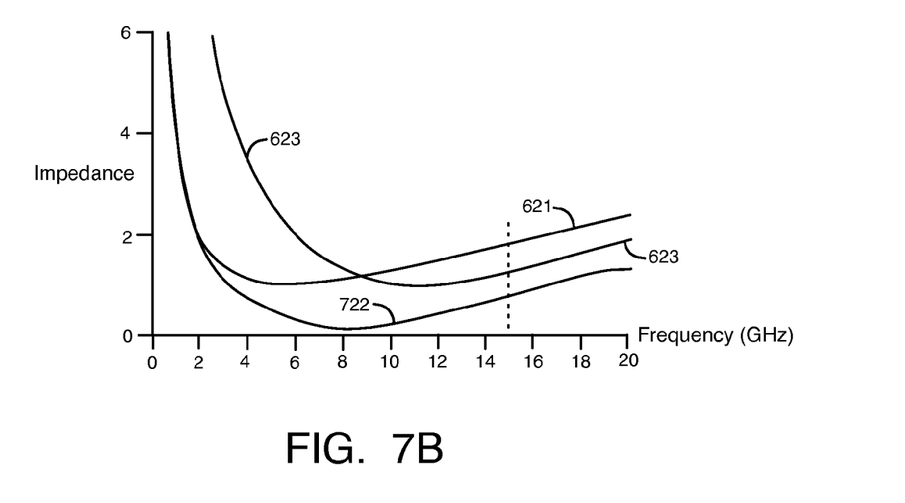
FIG. 7B is a graph that shows the impedance of the regulated supply voltage delivery circuit for the LC tank circuit in FIG. 7A over various frequencies, according to an embodiment of the present invention.

FIG. 7B is a graph that shows the impedance of the supply voltage delivery circuit for the LC tank circuit 708 in FIG. 7A over various frequencies in the output clock signals of the LC tank circuit 708, according to an embodiment of the present invention. In FIG. 7B, curve 722 shows the variations in the impedance of the LC circuit that includes load capacitor 704 and delivery inductances 714 and 718 over variations in the frequencies of the output clock signals VCK of LC tank circuit 708. FIG. 7B also shows two of the curves 621 and 623 from FIG. 6C for comparison to curve 722. The curve 722 shown in FIG. 7B was generated assuming the resistance of parasitic resistor 707 is 1 ohm. Curve 722 is generated using a capacitance C2 of 10.75 pF for each of capacitors 701-704, an inductance LVCC1 of 116 pH for inductor 711, an inductance LVSS1 of 115 pH for inductor 715, an inductance LVCC2/3 of 15.67 pH for each of inductors 712-714, and an inductance LVSS2/3 of 15 pH for each of inductors 716-718. Also, curve 722 is generated using a mutual inductance LMU1 of 113 pH between inductors 711 and 715 and a mutual inductance LMU2/3 of 13 pH between each pair of inductors 712/716, 713/717, and 714/718. Thus, the inductance and capacitance values used to generate curve 722 are comparable to the inductance and capacitance values used to generate curve 623.

As shown in FIG. 7B, at a frequency of about 8 GHz in clock signals VCK, curve 722 reaches its minimum impedance close to zero, because parasitic resistor 707 is far away from the LC circuit 704/714/718. The impedances of curve 722 are less than the impedances of curve 623 at all of the frequencies shown in FIG. 7B. For example, at a frequency of 15 GHz in clock signals VCK, the impedance of curve 722 is less than the impedance of curve 623, as shown at the dotted line in FIG. 7B. As shown by curve 722, by providing a distributed load capacitance in load capacitors 701-704, and by distributing the delivery inductances 711-718 between the four load capacitors 701-704, the impedance of the LC circuit 704/714/718 coupled to LC tank circuit 708 is reduced. The reduction in the impedance of the LC circuit 704/714/718 coupled to LC tank circuit 708 causes a reduction in the supply voltage noise in supply voltage VREG. The reduction in the supply voltage noise in supply voltage VREG reduces noise that is cross-coupled through a semiconductor substrate between the supply voltage delivery circuits of two PLL circuits coupled to the substrate, as described above.

Figure 8:
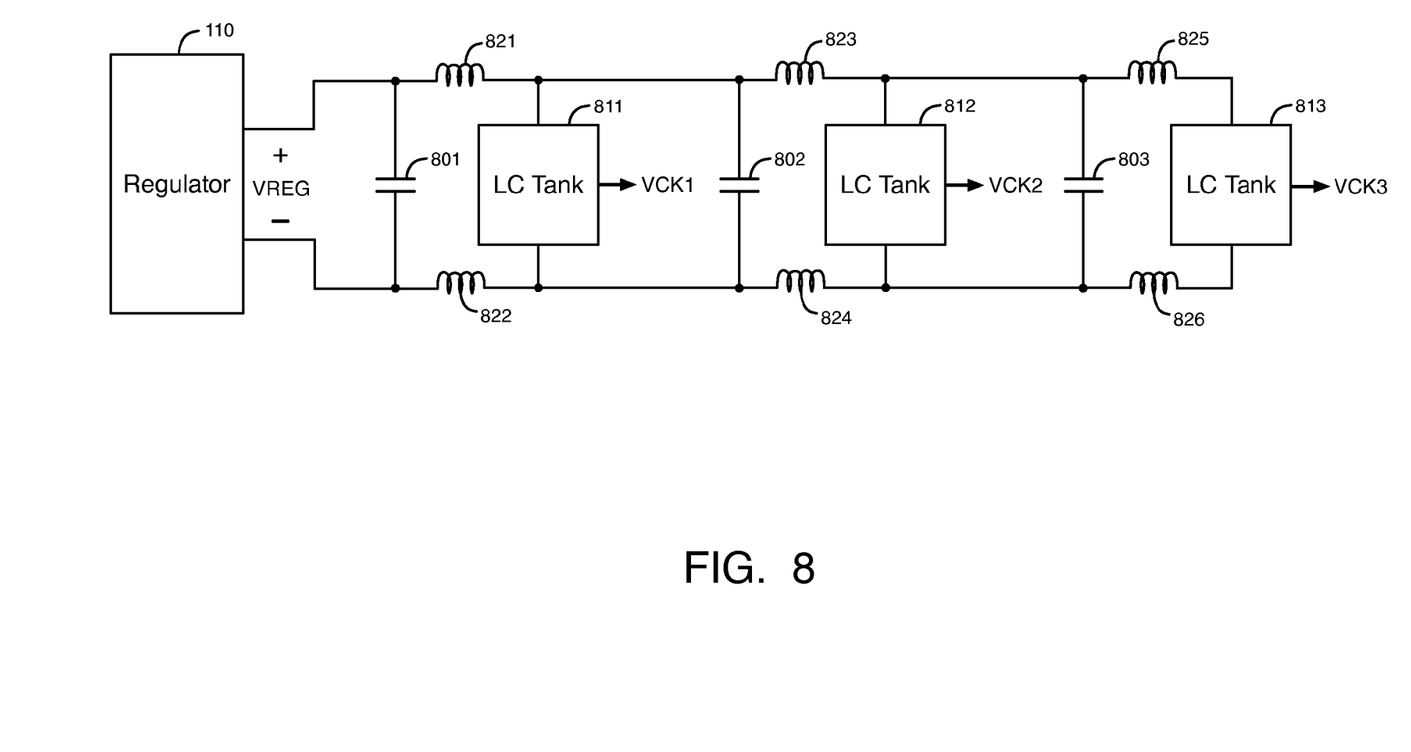
FIG. 8 illustrates a portion of a phase-locked loop (PLL) circuit including a regulator circuit, three load capacitors, and three LC tank circuits having optimized frequency assignments, according to another embodiment of the present invention.

FIG. 8 illustrates a portion of a phase-locked loop (PLL) circuit including regulator circuit 110, three load capacitors 801-803, and three LC tank circuits 811-813 having optimized frequency assignments, according to another embodiment of the present invention. In the embodiment of FIG. 8, regulator circuit 110 provides a regulated supply voltage VREG to each of LC tank circuits 811-813 through a supply voltage delivery circuit that includes capacitors 801-803 and conductors that have delivery inductances 821-826. LC tank circuits 811-813 are part of one or more oscillator circuits in the PLL. In the embodiment of FIG. 8, LC tank circuits 811, 812, and 813 generate different frequency ranges in their respective output clock signals VCK1, VCK2, and VCK3. LC tank circuits 811-813 may generate overlapping frequency ranges in their respective output clock signals VCK1-VCK3.

Among LC tank circuits 811-813, LC tank circuit 811 generates the highest range of frequencies in its output clock signals VCK1. Among LC tank circuits 811-813, LC tank circuit 812 generates the second highest range of frequencies in its output clock signals VCK2. Among LC tank circuits 811-813, LC tank circuit 813 generates the lowest range of frequencies in its output clock signals VCK3. By assigning the frequency ranges of the output clock signals VCK1-VCK3 of LC tank circuits 811-813 in this way, the capacitances of load capacitors 801-803 can be reduced, while maintaining the same amount of low pass filtering of supply voltage VREG.

Assigning the frequency ranges of the output clock signals VCK1-VCK3 of LC tank circuits 811-813 in this way also reduces the power delivery inductance requirement. LC tank circuit 811 draws more current from regulator 110 than LC tank circuits 812-813, because the frequencies of clock signals VCK1 are higher. But LC tank circuit 811 is affected by less of the delivery inductance in the supply voltage delivery circuit than LC tank circuits 812-813. LC tank circuit 813 is affected by more of the delivery inductance in the supply voltage delivery circuit than LC tank circuits 811-812. But LC tank circuit 813 draws less current from regulator 110 than LC tank circuits 811-812, because the frequencies of clock signals VCK3 are lower. Therefore, the supply voltage noise generated by each of the LC tank circuits 811-813 in the supply voltage delivery circuit is more balanced.

According to an embodiment, the capacitance of load capacitor 801 is selected to cause a resonant frequency of load capacitor 801 and delivery inductances 821-822 to be closer to an operating frequency of at least one of the clock signals VCK1 generated by LC tank circuit 811. The capacitance of load capacitor 802 is selected to cause a resonant frequency of load capacitor 802 and delivery inductances 823-824 to be closer to an operating frequency of at least one of the clock signals VCK2 generated by LC tank circuit 812. The capacitance of load capacitor 803 is selected to cause a resonant frequency of load capacitor 803 and delivery inductances 825-826 to be closer to an operating frequency of at least one of the clock signals VCK3 generated by LC tank circuit 813. This embodiment reduces supply voltage noise in the supply voltage delivery circuit over the frequency range of the PLL circuit of FIG. 8.

Figure 9:
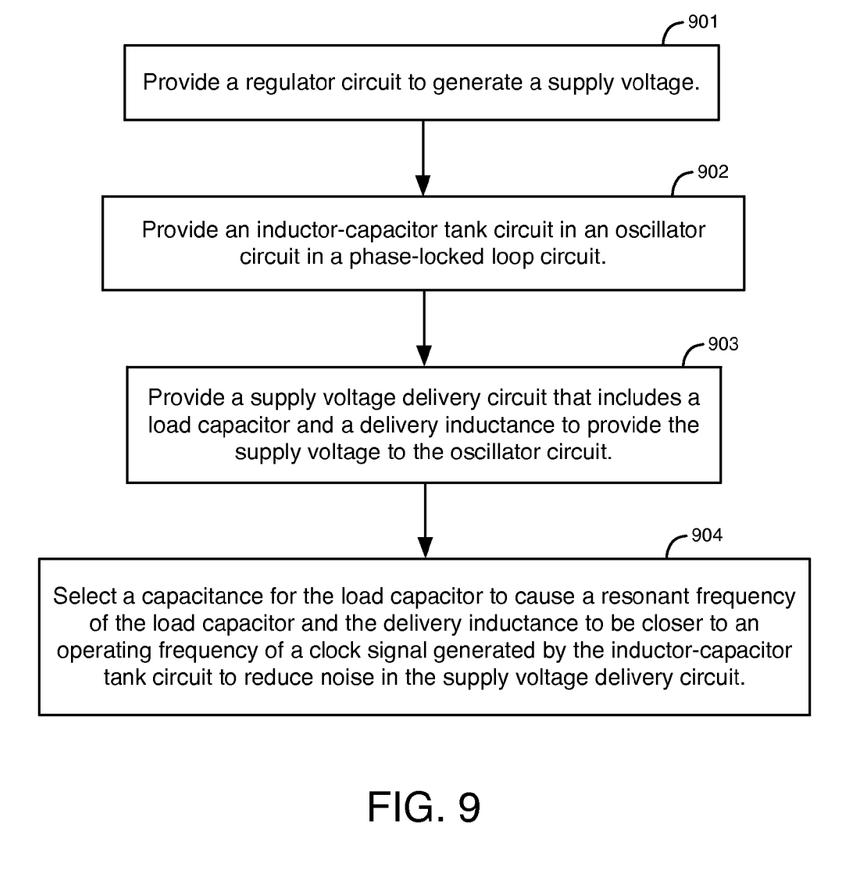
FIG. 9 is a flow chart that shows operations for manufacturing an integrated circuit that includes a regulator circuit and an LC tank circuit, according to an embodiment of the present invention.

FIG. 9 is a flow chart that shows operations for manufacturing an integrated circuit that includes a regulator circuit and a phase-locked loop (PLL) circuit, according to an embodiment of the present invention. In operation 901, the regulator circuit is provided to generate a supply voltage. In operation 902, an inductor-capacitor (LC) tank circuit is provided in an oscillator circuit in the phase-locked loop circuit. In operation 903, a supply voltage delivery circuit that includes a load capacitor and a delivery inductance is provided to provide the supply voltage to the oscillator circuit. In operation 904, a capacitance for the load capacitor is selected to cause a resonant frequency of the load capacitor and the delivery inductance to be closer to an operating frequency of a clock signal generated by the inductor-capacitor tank circuit to reduce noise in the supply voltage delivery circuit.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A phase-locked loop circuit comprising:
   a regulator circuit to generate a supply voltage;
   first and second inductor-capacitor tank circuits;
   a first load capacitor coupled to the regulator circuit and to the first inductor-capacitor tank circuit, wherein the first load capacitor provides current for the supply voltage to the first inductor-capacitor tank circuit; and
   a second load capacitor coupled to the regulator circuit and to the second inductor-capacitor tank circuit, wherein the second load capacitor provides current for the supply voltage to the second inductor-capacitor tank circuit.

2. The phase-locked loop circuit of claim 1, wherein each of the first and the second inductor-capacitor tank circuits is part of an oscillator circuit in the phase-locked loop circuit.

3. The phase-locked loop circuit of claim 1, further comprising:
   a third inductor-capacitor tank circuit; and
   a third load capacitor coupled to the regulator circuit and to the third inductor-capacitor tank circuit, wherein the third load capacitor provides current for the supply voltage to the third inductor-capacitor tank circuit.

4. The phase-locked loop circuit of claim 3, further comprising:
   a supply voltage delivery circuit that comprises a delivery inductance and the third load capacitor, wherein a resonant frequency of the delivery inductance and the third load capacitor is within 30% of a frequency of a periodic signal generated by the third inductor-capacitor tank circuit.

5. The phase-locked loop circuit of claim 1, further comprising:
   a supply voltage delivery circuit that comprises a first delivery inductance and the first load capacitor, wherein a resonant frequency of the first delivery inductance and the first load capacitor is substantially equal to a frequency of a periodic signal generated by the first inductor-capacitor tank circuit.

6. The phase-locked loop circuit of claim 5, wherein the supply voltage delivery circuit further comprises a second delivery inductance and the second load capacitor, and wherein a resonant frequency of the second delivery inductance and the second load capacitor is substantially equal to a frequency of a periodic signal generated by the second inductor-capacitor tank circuit.

7. A method for manufacturing an integrated circuit comprising:
   providing a first regulator circuit to generate a first supply voltage;
   providing a first inductor-capacitor tank circuit in a first oscillator circuit in a first phase-locked loop circuit in the integrated circuit;
   providing a first supply voltage delivery circuit comprising a first load capacitor and a first delivery inductance to provide the first supply voltage to the first oscillator circuit; and
   selecting a capacitance for the first load capacitor to cause a resonant frequency of the first load capacitor and the first delivery inductance to be closer to an operating frequency of a first clock signal to be generated by the first inductor-capacitor tank circuit to reduce noise in the first supply voltage delivery circuit.

8. The method of claim 7, further comprising:
   providing a second regulator circuit to generate a second supply voltage;
   providing a second inductor-capacitor tank circuit in a second oscillator circuit in a second phase-locked loop circuit in the integrated circuit;
   providing a second supply voltage delivery circuit comprising a second load capacitor and a second delivery inductance to provide the second supply voltage to the second oscillator circuit, wherein the first and the second supply voltage delivery circuits are coupled to a substrate in the integrated circuit; and
   selecting a capacitance for the second load capacitor to cause a resonant frequency of the second load capacitor and the second delivery inductance to be closer to an operating frequency of a second clock signal to be generated by the second inductor-capacitor tank circuit to reduce cross-coupling of noise through the substrate between the first and the second supply voltage delivery circuits.

9. The method of claim 7, further comprising:
providing a second inductor-capacitor tank circuit in the first phase-locked loop circuit, wherein the first supply voltage delivery circuit comprises a second load capacitor and a second delivery inductance to provide the first supply voltage to the second inductor-capacitor tank circuit; and
selecting a capacitance for the second load capacitor to cause a resonant frequency of the second load capacitor and the second delivery inductance to be closer to an operating frequency of a second clock signal to be generated by the second inductor-capacitor tank circuit to reduce noise in the first supply voltage delivery circuit.

10. The method of claim 9, further comprising:
providing a second regulator circuit to generate a second supply voltage;
providing a third inductor-capacitor tank circuit in a second oscillator circuit in a second phase-locked loop circuit in the integrated circuit;
providing a second supply voltage delivery circuit comprising a third load capacitor and a third delivery inductance to provide the second supply voltage to the second oscillator circuit, wherein the first and the second supply voltage delivery circuits are coupled to a substrate in the integrated circuit; and
selecting a capacitance for the third load capacitor to cause a resonant frequency of the third load capacitor and the third delivery inductance to be closer to an operating frequency of a third clock signal to be generated by the third inductor-capacitor tank circuit to reduce cross-coupling of noise through the substrate between the first and the second supply voltage delivery circuits.

11. The method of claim 10, further comprising:
providing a fourth inductor-capacitor tank circuit in the second phase-locked loop circuit, wherein the second supply voltage delivery circuit comprises a fourth load capacitor and a fourth delivery inductance to provide the second supply voltage to the fourth inductor-capacitor tank circuit; and
selecting a capacitance for the fourth load capacitor to cause a resonant frequency of the fourth load capacitor and the fourth delivery inductance to be closer to an operating frequency of a fourth clock signal to be generated by the fourth inductor-capacitor tank circuit to reduce noise in the second supply voltage delivery circuit.

12. The method of claim 9, wherein the first supply voltage delivery circuit further comprises a third delivery inductance coupled between the first inductor-capacitor tank circuit and a node at a ground voltage, and wherein the first supply voltage delivery circuit further comprises a fourth delivery inductance coupled between the second inductor-capacitor tank circuit and the third delivery inductance.

13. The method of claim 9, wherein selecting a capacitance for the first load capacitor and selecting a capacitance for the second load capacitor further comprise distributing a loading capacitance for the first regulator circuit between the first and the second load capacitors to reduce the first and the second delivery inductances.

14. The method of claim 9, wherein providing a first inductor-capacitor tank circuit and providing a second inductor-capacitor tank circuit further comprise placing the first inductor-capacitor tank circuit closer to the first regulator circuit than the second inductor-capacitor tank circuit, and wherein the first inductor-capacitor tank circuit generates a frequency range for the first clock signal that is greater than a frequency range that the second inductor-capacitor tank circuit generates for the second clock signal.

15. A method for operating a phase-locked loop circuit comprising:
generating a supply voltage using a regulator circuit;
generating a first clock signal using a first inductor-capacitor tank circuit in a first mode of operation of the phase-locked loop circuit;
generating a second clock signal using a second inductor-capacitor tank circuit in a second mode of operation of the phase-locked loop circuit;
providing current for the supply voltage to the first inductor-capacitor tank circuit using a first load capacitor coupled to the first inductor-capacitor tank circuit; and
providing current for the supply voltage to the second inductor-capacitor tank circuit using a second load capacitor coupled to the second inductor-capacitor tank circuit.

16. The method of claim 15, wherein each of the first and the second load capacitors has substantially a same capacitance.

17. The method of claim 15, further comprising:
generating a third clock signal using a third inductor-capacitor tank circuit in a third mode of operation of the phase-locked loop circuit; and
providing current for the supply voltage to the third inductor-capacitor tank circuit using a third load capacitor coupled to the third inductor-capacitor tank circuit.

18. The method of claim 17, wherein each of the first, the second, and the third inductor-capacitor tank circuits is part of a same oscillator circuit in the phase-locked loop circuit.

19. The method of claim 15, wherein providing current for the supply voltage to the first inductor-capacitor tank circuit using a first load capacitor comprises providing the current for the supply voltage to the first inductor-capacitor tank circuit using a supply voltage delivery circuit that comprises a first delivery inductance and the first load capacitor, and wherein a resonant frequency of the first delivery inductance and the first load capacitor is substantially equal to a frequency of the first clock signal generated by the first inductor-capacitor tank circuit.

20. The method of claim 19, wherein providing current for the supply voltage to the second inductor-capacitor tank circuit using a second load capacitor comprises providing the current for the supply voltage to the second inductor-capacitor tank circuit using the supply voltage delivery circuit that further comprises a second delivery inductance and the second load capacitor, and wherein a resonant frequency of the second delivery inductance and the second load capacitor is substantially equal to a frequency of the second clock signal generated by the second inductor-capacitor tank circuit.

* * * * *